United States Patent [19]
Yamamuro et al.
[11] Patent Number: 4,472,834
[45] Date of Patent: Sep. 18, 1984

[54] LOUDSPEAKER SYSTEM

[75] Inventors: Isao Yamamuro; Kunihiko Shimada, both of Saitama, Japan
[73] Assignee: Pioneer Electronic Corporation, Tokyo, Japan

[21] Appl. No.: 311,355
[22] Filed: Oct. 14, 1981
[30] Foreign Application Priority Data
Oct. 16, 1980 [JP] Japan ................................ 55-144619
[51] Int. Cl.³ ........................ H03G 3/00; H04R 5/00
[52] U.S. Cl. ...................................... 381/61; 381/63; 381/24
[58] Field of Search ................ 179/1 AT, 1 J, 1 GA; 381/24, 61, 62, 63, 64, 65, 82, 99, 100

[56] References Cited

U.S. PATENT DOCUMENTS 3,585,311 6/1971 Berkley et al. .
3,665,105 5/1972 Chowning ...................... 179/1 J X
3,992,582 11/1976 Osakabe ............................. 381/63
4,039,755 8/1977 Berkovitz ....................... 179/1 J X
4,061,876 12/1977 Jaffe ................................ 179/1 AT
4,186,643 2/1980 Nishibe et al. ................. 179/1 J X
4,349,697 9/1982 Skabla ............................ 179/1 J X

FOREIGN PATENT DOCUMENTS 56-116397 9/1981 Japan ............................. 179/1 GA

*Primary Examiner*—G. Z. Rubinson
*Assistant Examiner*—Keith E. George
*Attorney, Agent, or Firm*—Sughrue, Mion, Zinn, Macpeak & Seas

[57] ABSTRACT

A plurality of delay circuits each having a different delay time are inserted between an audio signal source and each speaker in a multiple-speaker system so that the frequency dependence of speaker system directivity is reduced. If desired, the audio signal can be divided into different frequency band signals with each frequency band signal subjected to a different delay or set of delays.

3 Claims, 7 Drawing Figures

LOUDSPEAKER SYSTEM

BACKGROUND OF THE INVENTION

This invention relates to loudspeaker systems, and more particularly to a loudspeaker system in which a plurality of loudspeaker units are employed to provide a desired directivity pattern.

A loudspeaker system is known in the art, in which a plurality of loudspeakers are used to provide a desired directivity so that sound is transmitted only in a desired direction and no sound is transmitted towards a microphone which is the sound source, so as to prevent howling (or acoustic feedback). One example of the loudspeaker system of this type is a so-called Tonesäulen type loudspeaker system in which, as shown in FIG. 1, a plurality of loudspeaker units 1 through 6 are arranged in a single speaker assembly, all of the speakers having an equal diameter. As used herein, the term "speaker assembly" refers to a plurality of loudspeakers in a single enclosure or, if in separate enclosures, disposed immediately adjacent one another so that the listener cannot discern any "separation" and the speaker assembly will appear to the listener as a single sound source. If, in the case where these loudspeaker units 1 through 6 are point sound sources and are arranged on a straight line at equal intervals d as shown in FIG. 2, the angle measured from the perpendicular bisector Z of the X-axis is represented by Y, then the directivity factor D is represented by the following expression (1):

$$D = \left| \frac{\sin\left(\frac{nkd}{2} \sin\gamma\right)}{n \sin\left(\frac{kd}{2} \sin\gamma\right)} \right| \quad (1)$$

where $k=\omega/c$, $\omega$ is the angular frequency, and c is the sound propagation velocity.

FIG. 3 shows the directivity patterns in the case of kd=0.5, kd=2 and kd=8. In the case of kd=8, the directivity pattern is very sharp, but the directivity pattern unfortunately changes with frequency.

SUMMARY OF THE INVENTION

Accordingly, an object of this invention is to provided a loudspeaker system which can provide a directivity pattern as desired, which is substantially constant and independent of frequency.

Briefly, this is achieved by a loudspeaker system according to one embodiment of this invention wherein an audio signal is delayed by delay means different in delay time from one another, so that the outputs of the delay means drive a plurality of respective loudspeakers. In a second embodiment, an audio signal is divided into at least two frequency band signals, each of which is delayed by delay means different in delay time from one another, so that the outputs of the delay means drive a plurality of loudspeakers.

DETAILED DESCRIPTION OF THE PREFERRED EMBODIMENTS

This invention will now be described with reference to FIGS. 4 through 7.

Figure 1:
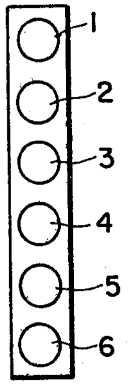
FIG. 1 is an explanatory diagram showing the arrangement of a Tonsäulen type loudspeaker system.
Figure 2:
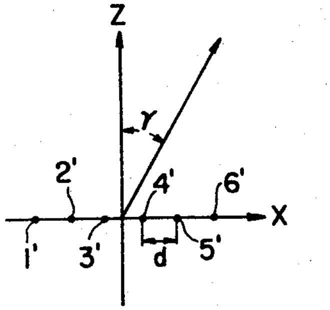
FIG. 2 is an explanatory diagram concerning the directivity of the loudspeaker system in FIG. 1.
Figure 3:
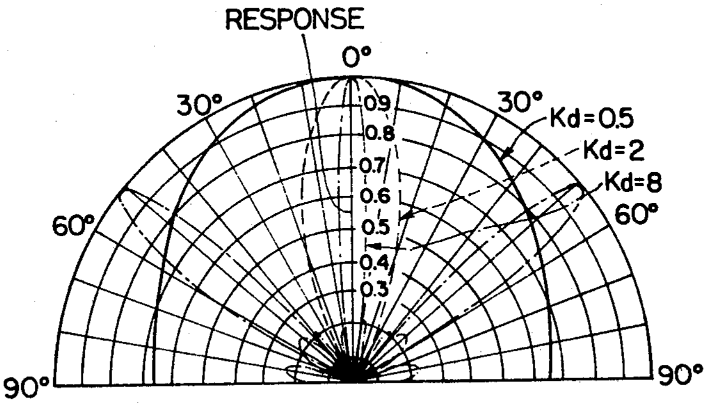
FIG. 3 is a diagram showing the directivity pattern of the loudspeaker system in FIG. 1.
Figure 4:
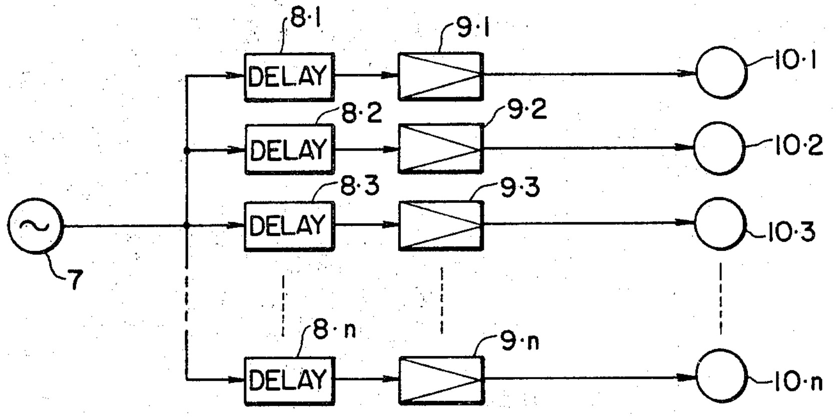
FIG. 4 is a block diagram showing a first example of a loudspeaker system according to this invention.
Figure 5:
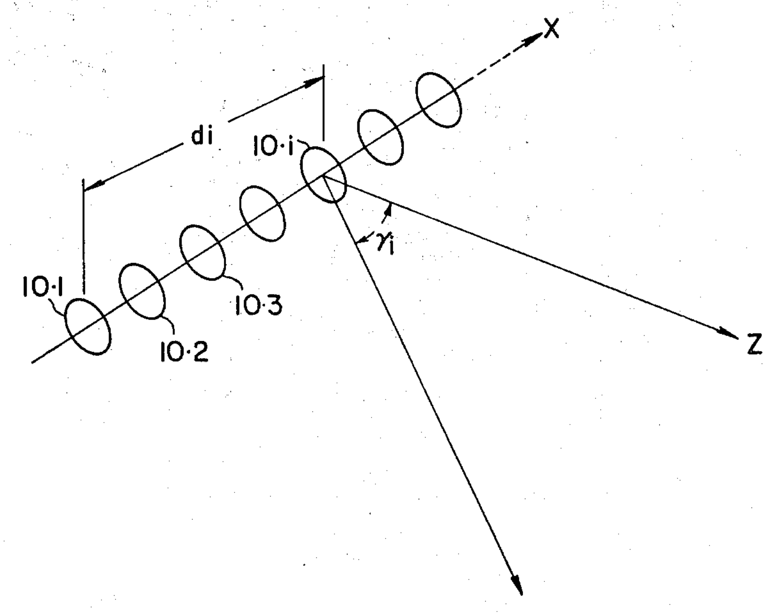
FIG. 5 is an explanatory diagram concerning the directivity of the loudspeaker system in FIG. 4.

FIG. 4 is a block diagram showing a first example of a loudspeaker system according to this invention. An audio signal from a signal source 7 is applied to delay circuits 8.1, 8.2, 8.3 . . . and 8.n which are different in delay time from one another. The delay outputs, after being amplified by respective amplifiers 9.1, 9.2, 9.3 . . . and 9.n, are applied, as drive inputs, to respective loudspeakers 10.1, 10.2, 10.3 . . . and 10.n.

If these loudspeakers have equal diameters a and are arranged on one straight line X to form a straight line sound source, the directivity factor D at an infinite point can be represented by the following expression (2):

$$D^2 = \frac{1}{\left(\sum_{i=1}^{n} Pi\right)^2} \left[ \left\{ \sum_{i=1}^{n} Pi \frac{2J_1(ka \sin\gamma)}{ka \sin\gamma} \cdot \cos(kdi) \right\}^2 + \left\{ \sum_{i=1}^{n} Pi \frac{2J_1(ka \sin\gamma)}{ka \sin\gamma} \cdot \sin(kdi) \right\}^2 \right] \quad (2)$$

where Pi is the output power of the i-th loudspeaker 10.i from the reference loudspeaker 10.1; a is the effective vibration radius of each loudspeaker; di is the distance between the reference loudspeaker 10.1 and the i-th loudspeaker; $k=2\pi f/c$; $J_1(x)$ is the primary bessel function; and Y is the angle formed between the main axis (z) of the loudspeaker 10.1 and the observation direction.

If it is assumed that signals delayed by $\tau_1$ through $\tau_n$ by the delay circuits 8.1 through 8.n are applied to the loudspeakers 10.1 through 10.n, respectively, then it can be considered that the phase term (di) in the expression (2) is varied with delay time $\tau_i$. That is, the directivity factor D can be varied as desired within the range defined by the expression (2) by varying the delay time $\tau_i$. Unlike the expression (1) which is expressed in terms of k or frequency only, the expression (2) includes the functions of delay time. Therefore, the frequency dependence of the directivity pattern of the loudspeaker system is much smaller than that of the conventional loudspeaker. By suitably selecting the value D, the variations of sound pressure depending on the listening positions can be minimized, and the optimum listening range can be increased. This is effective in increasing the listening range especially when stereo signals are reproduced.

Figure 6:
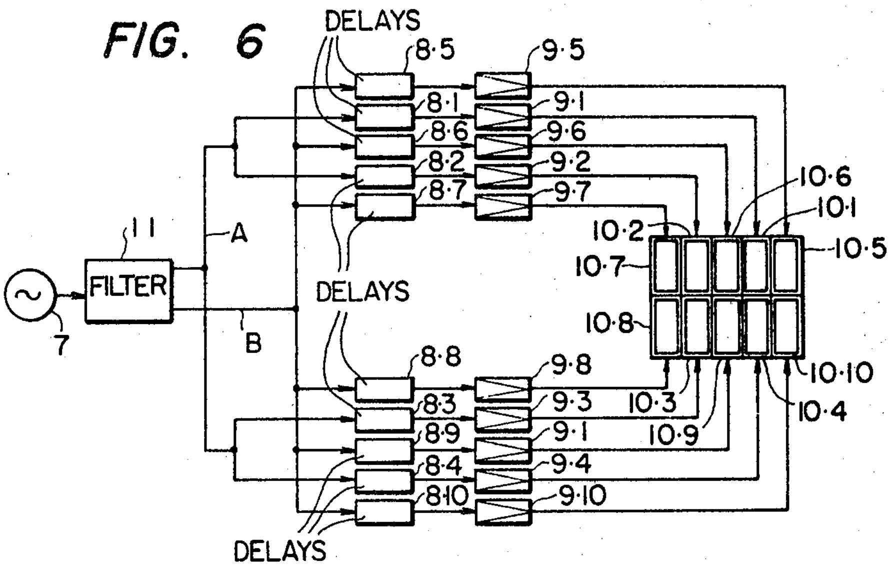
FIGS. 6 and 7 are block diagrams showing second and third examples, respectively, of the loudspeaker system according to this invention.

FIG. 6 is a block diagram showing a second example of the loudspeaker system according to this invention. In this example, an audio signal from a signal source 7 is divided into two frequency band signals A and B by a frequency division circuit 11 such as a filter, and these signals are subjected to time delay. The frequency band signal A is applied through delay circuits 8.1, 8.2, 8.3 and 8.4 to amplifiers 9.1, 9.2, 9.3 and 9.4, respectively. The outputs of these amplifiers drive rectangular loudspeaker units 10.1, 10.2, 10.3 and 10.4, respectively. Similarly, the other frequency band signal B is applied to delay circuits 8.5 through 8.10, the outputs of which are applied to amplifiers 9.5 through 9.10, respectively, where they are amplified to drive rectangular loudspeaker units 10.5 through 10.10, respectively.

It can be readily understood that the division of the frequency band of the signal reduces the effect of the variation of directivity factor due to the frequency of the loudspeaker unit itself, since the directivity factor for each speaker group need be controlled over a smaller frequency range. Therefore, the loudspeaker system in FIG. 6 can more readily control the directivity factor than the loudspeaker system of FIG. 4 in which the directivity factor is controlled only by the delay time. If one group of speakers is designed to handle a frequency band which is most troublesome to the directivity of the other group, and vice versa, directivity variations can be substantially further reduced. In the second example described above, the audio signal from the signal source is divided into more than two frequency band signals, which are each subjected to time delay. In FIG. 6, the rectangular loudspeaker units are arranged in such a manner that the long sides thereof are adjacent to one another; however, they may be arranged in such a manner that the short sides are set side by side. Furthermore, instead of the rectangular loudspeaker units, circular loudspeaker units may be employed.

Figure 7:
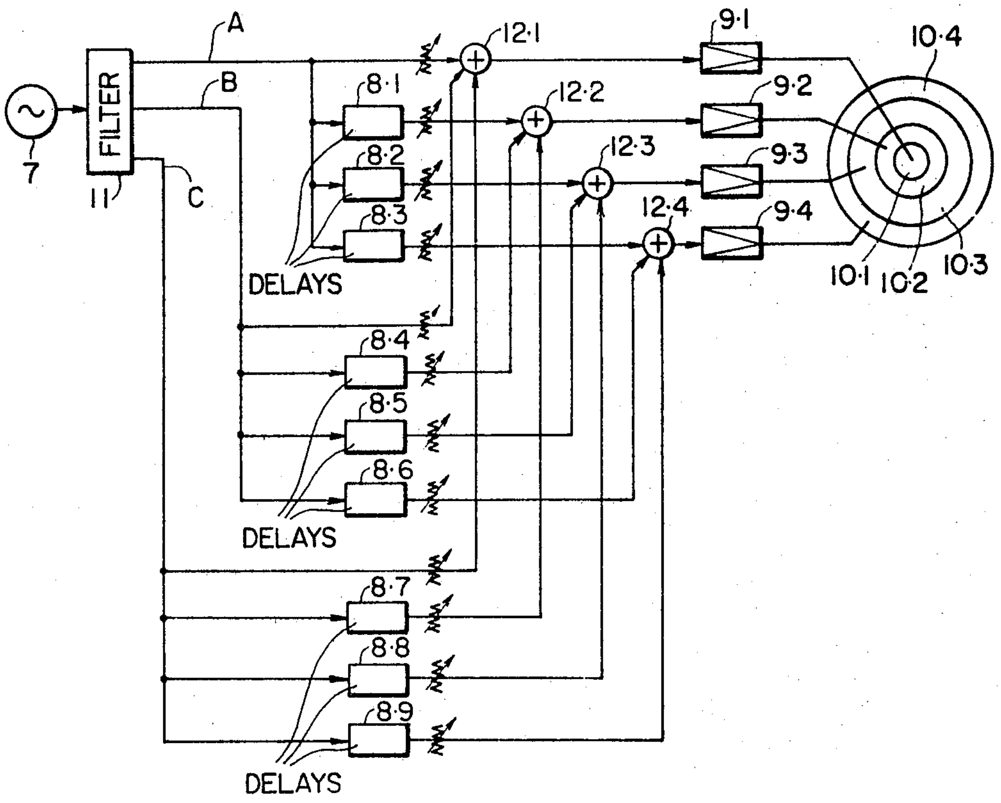

FIG. 7 is a block diagram showing a third example of the loudspeaker system according to this invention. An audio signal is divided into three frequency band signals A, B and C by a filter circuit 11. The signal A is delayed by delay circuits 8.1 through 8.3. The signal B is delayed by delay circuits 8.4 through 8.6. The signal C is delayed by delay circuits 8.7 through 8.10. The signals A, B and C are combined by an adder 12.1, the output of which is used to drive a coaxial loudspeaker 10.1 through amplifier 9.1. The outputs of the delay circuits 8.1, 8.4 and 8.7 are combined by an adder 12.2. The outputs of the delay circuits 8.2, 8.5 and 8.8 are combined by an adder 12.3. The outputs of the delay circuits 8.3, 8.6 and 8.9 are combined by an adder 12.4. The outputs of these adders 12.2, 12.3 and 12.4 are applied through amplifiers 9.2, 9.3 and 9.4 to loudspeakers 10.2, 10.3 and 10.4, respectively.

The third example in FIG. 7 is advantageous in that it has the same effect as that in the second example in FIG. 6 in that different frequency ranges can be delayed by different amounts, but the number of loudspeakers can be reduced. FIG. 7 shows the coaxial loudspeakers, but it is clear that the invention is not limited thereto or thereby.

As is apparent from the above description, according to this invention, the directivity pattern can be made substantially constant irrespective of frequency, the directivity pattern can be changed as desired by changing the delay time, and the optimum listening range can be increased.

What is claimed is:

1. A loudspeaker system, comprising:

an audio signal source for generating an audio signal;

band dividing means for separating said audio signal into at least first and second signals occupying first and second frequency bands respectively;

at least first and second delay means having different delay times, said first delay means receiving said first signal and said second delay means receiving said second signal, said first delay means comprising at least two delay circuits having delay times different from one another and commonly receiving said first signal and said second delay means comprising at least two circuits having delay times different from one another and commonly receiving said second signal; and at least one speaker assembly having a first loudspeaker driven by the output from said first delay means and a second loudspeaker driven by the output of said second delay means.

2. A loudspeaker system, comprising:

an audio signal source for generating an audio signal;

band dividing means for dividing said audio signal into a plurality of signals each occupying a different frequency band;

at least one speaker assembly having a plurality of loudspeakers;

a plurality of groups of delay circuits, each group including a plurality of delay circuits receiving one of said plurality of signals as a common input and the delay circuits in each group having delay times which differ from one another;

a plurality of combining means each of which combines a different combination of delay circuit outputs from selected ones of said delay circuits, the output of each said combining means driving a different respective one of said loudspeakers.

3. A loudspeaker system as defined in claim 2, wherein each of said combining means combines delay circuit outputs from a plurality of said groups of delay circuits.

* * * * *